United States Patent [19]
Lenz

[11] Patent Number: 5,557,204
[45] Date of Patent: Sep. 17, 1996

[54] METHOD FOR THE OPERATION OF A NUCLEAR MAGNETIC RESONANCE TOMOGRAPOHY APPARATUS FOR THE ACQUISITION OF AT LEAST TWO DIFFERENTLY WEIGHTED IMAGES

[75] Inventor: Gerald Lenz, Neunkirchen am Brand, Germany

[73] Assignee: Siemens Aktiengesellschaft, Munich, Germany

[21] Appl. No.: 510,145

[22] Filed: Aug. 2, 1995

[30] Foreign Application Priority Data

Aug. 3, 1994 [DE] Germany ............. 44 27 496.3

[51] Int. Cl.$^6$ ..................................... G01R 33/48
[52] U.S. Cl. ........................................ 324/309
[58] Field of Search ....................... 324/309, 307, 324/300, 312, 311, 314, 318; 128/653.2

[56] References Cited

U.S. PATENT DOCUMENTS

| | | | |
|---|---|---|---|
| 4,966,149 | 10/1990 | Stokar | 324/304 |
| 5,168,226 | 12/1992 | Hinks | 324/309 |
| 5,262,725 | 11/1993 | Cuppen et al. | 324/312 |
| 5,289,126 | 2/1994 | Mori et al. | 324/309 |
| 5,311,133 | 5/1994 | Dannels | 324/309 |
| 5,337,000 | 8/1994 | Bruder | 324/309 |

FOREIGN PATENT DOCUMENTS

0571212A1 11/1993 European Pat. Off..

OTHER PUBLICATIONS

Magnetic Resonance In Medicine, 3,823–833 (1986) Article entitled "Rare Imaging; a Fast Imaging Method for Clinical MR" by J. Hennig, A. Naventh and H. Friedburg.

*Primary Examiner*—Sandra L. O'Shea
*Assistant Examiner*—Raymond Y. Mah
*Attorney, Agent, or Firm*—Hill, Steadman & Simpson

[57] ABSTRACT

In a turbo-spin echo sequence, nuclear magnetic resonance signals lying chronologically closer to an excitation phase are entered into a first raw data matrix for the acquisition of a proton-density-weighted image and nuclear magnetic resonance signals lying farther from the excitation phase are entered into a second raw data matrix for the acquisition of a T2-weighted image. Fewer rows are acquired for the first raw data matrix after every excitation phase than are acquired for the second raw data matrix. This avoids nuclear magnetic resonance signals that are already relatively strongly T2-weighted from being employed for the acquisition of a proton-density-weighted image.

7 Claims, 5 Drawing Sheets

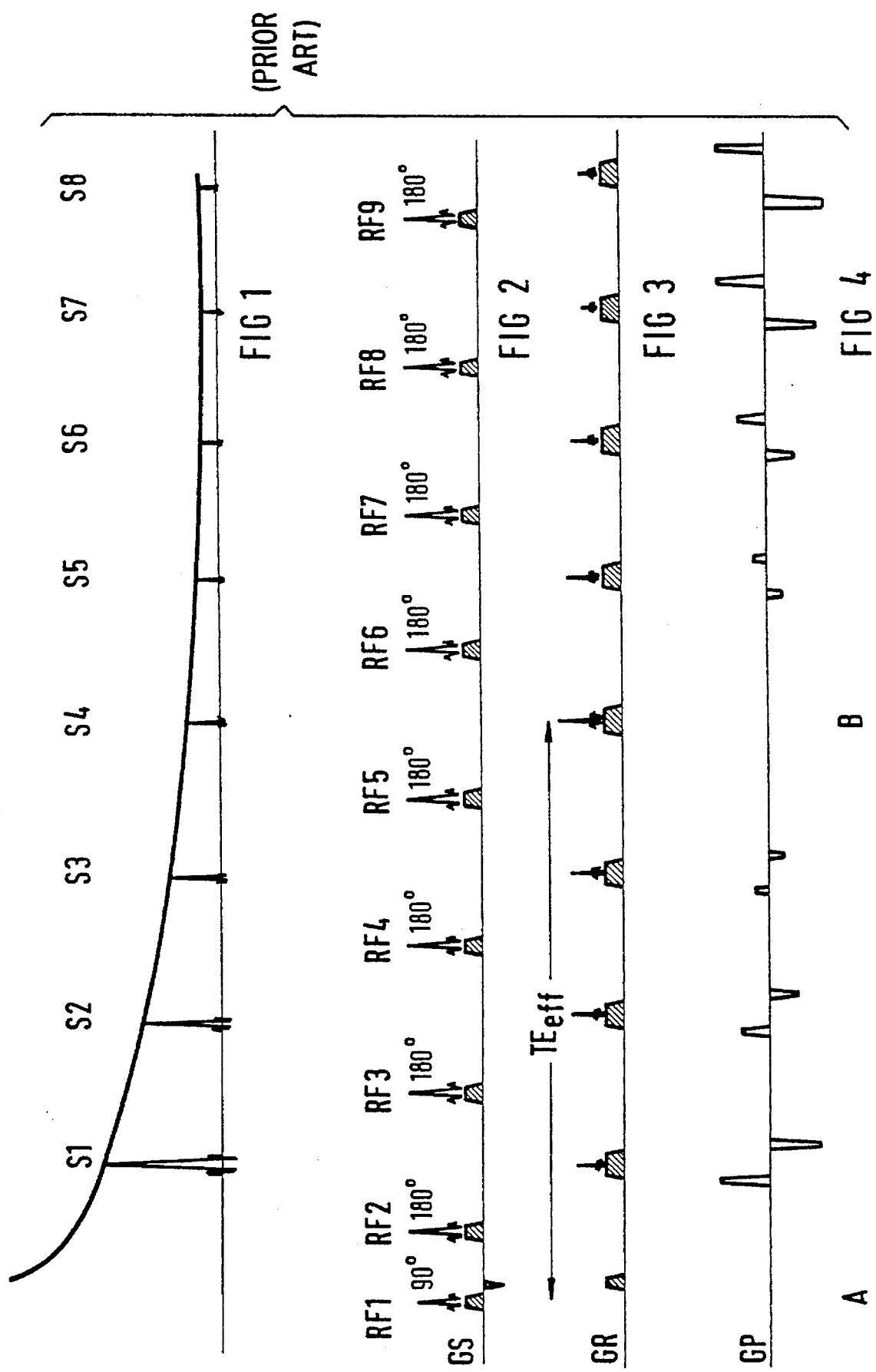

METHOD FOR THE OPERATION OF A NUCLEAR MAGNETIC RESONANCE TOMOGRAPOHY APPARATUS FOR THE ACQUISITION OF AT LEAST TWO DIFFERENTLY WEIGHTED IMAGES

BACKGROUND OF THE INVENTION

1. Field of the Invention

The present invention is directed to a method for operating a nuclear magnetic resonance tomography apparatus, and in particular to such a method for acquiring at least two differently weighted images.

2. Description of the Prior Art

A method for the operation of a nuclear magnetic resonance tomography apparatus for the acquisition of at least two differently weighted images which includes the following steps is known from U.S. Pat. No. 5,168,226. An examination subject is brought into a constant, uniform magnetic field. In an excitation phase, nuclear spins in the examination subject are caused to precess by activating a first radio-frequency pulse. In a read-out phase, RF-refocusing pulses are multiply emitted in succession, each of these being followed by at least one nuclear magnetic resonance signal that is spatially-encoded by phase-encoding and read-out gradients. The nuclear magnetic resonance signals acquired in the read-out phase are sampled and nuclear magnetic resonance signals that lie closer to the excitation phase are each entered in a row of a k-space of a first raw data matrix and nuclear magnetic resonance signals lying farther from the excitation phase are respectively entered into a row of a k-space of a second raw data matrix. These steps are repeated until all rows of the raw data matrices have been filled. An image is produced from each raw data matrix by Fourier transformation.

The fact is thereby exploited that nuclear magnetic resonance signals that closely follow the excitation are significantly more weakly T2 weighted than nuclear magnetic resonance signals that lie chronologically farther from the excitation. Expressed in other terms, the nuclear magnetic resonance signals following closely after the excitation are weighted with proton density and the nuclear magnetic resonance signals lying farther from the excitation are T2-weighted. A technique referred to as the "shared echo" technique is employed in the method disclosed in U.S. Pat. No. 5,168,226, i.e. only the central rows of each raw data matrix-which essentially determine the contrast-are separately measured for each raw data matrix, whereas the edge rows-which essentially determine the resolution-are measured only once and are used in common for both raw data matrices.

An article "RARE Imaging: A Fast Imaging Method for Clinical MR", Hennig et al., in the periodical "Magnetic Resonance in Medicine", Vol. 3, pp. 823–833 (1986), likewise discloses a turbo-spin echo sequence. It is noted in this article that the amplitudes of an echo train differ due to the T2 relaxation and that, dependent on the classification of the echoes into a raw data matrix, this can lead to pronounced artifacts. In order to avoid this, suitable phase-encoding sequences are proposed in the article. The acquisition of data sets for two images from one pulse train is not discussed.

European Application 571 212 likewise discloses a turbo-spin echo sequence wherein two echoes, respectively employed for producing separate images, are acquired after every radio-frequency refocusing pulse by inversion of the read-out gradient. A different T2 weighting of the two images is thereby achieved by appropriate classification of the echo signals into the two corresponding raw data matrices. The echo signals following closely after the excitation are entered into the middle rows in the first raw data matrix; later echo signals (i.e. echo signals more affected by T2 decay), by contrast, are entered into the second raw data matrix.

After each excitation, an equal number of signals for the raw data matrices are acquired for the two differently weighted images in the known methods.

In many instances, however, nuclear magnetic resonance signals that are already relatively strongly T2 weighted must be used for the proton-density-weighted image. This, however, leads to pronounced edge oscillation artifacts in the proton density image as well as to a mixed contrast that distinctly differs from the proton density image of a conventional spin echo sequence.

SUMMARY OF THE INVENTION

An object of the present invention is to provide a method for operating a nuclear magnetic resonance imaging apparatus of the type initially described the above-identified disadvantages are avoided.

This object is inventively achieved in accordance with the principles of the present invention by acquiring fewer rows for the first raw data matrix after every excitation phase than are acquired for the second raw data matrix. This avoids the use of highly T2-weighted nuclear magnetic resonance signals, so that the aforementioned disadvantages to not occur.

DESCRIPTION OF THE DRAWINGS

FIGS. 1–4 illustrate a conventional turbo-spin echo sequence for explaining a problem associated therewith.

DESCRIPTION OF THE PREFERRED EMBODIMENTS

FIGS. 1–4 show a known pulse sequence that is often referred to as "turbo-spin echo". According to FIG. 2, a 90° radio-frequency pulse RF1 is first activated for the excitation of the nuclear spins. This is followed by a number of 180° radio-frequency pulses RF2–RF9, each of which effects a refocusing of the nuclear spins, and, thus causing nuclear magnetic resonance signals S1–S8 in the form of spin echoes. All radio-frequency pulses RF1–RF9 are emitted in the presence of slice-selection gradients GS, so that they respectively act only on nuclear spins within one slice of the examination subject. The amplitude of the spin echoes S1–S8 decays with the time constant T2 leaving the phase-encoding gradient GP of consideration (as shown in FIG. 1). For frequency-encoding of the spin echoes S1–S8, a read-out gradient GR according to FIG. 3 is activated during the duration of each spin echo. Each spin echo S1–S8 is individually phase-encoded for spatial resolution in a second direction, this being achieved by a phase-encoding gradient GP according to FIG. 4 that precedes each spin echo S1–S8. The phase shift caused by these phase-encoding gradients is in turn canceled by a phase-encoding gradient of the opposite direction that follows every signal S1–S8. Taking the phase-encoding gradients into consideration, signal amplitudes entered for every read-out gradient pulse GR in FIG. 3 arise.

Figure 5:
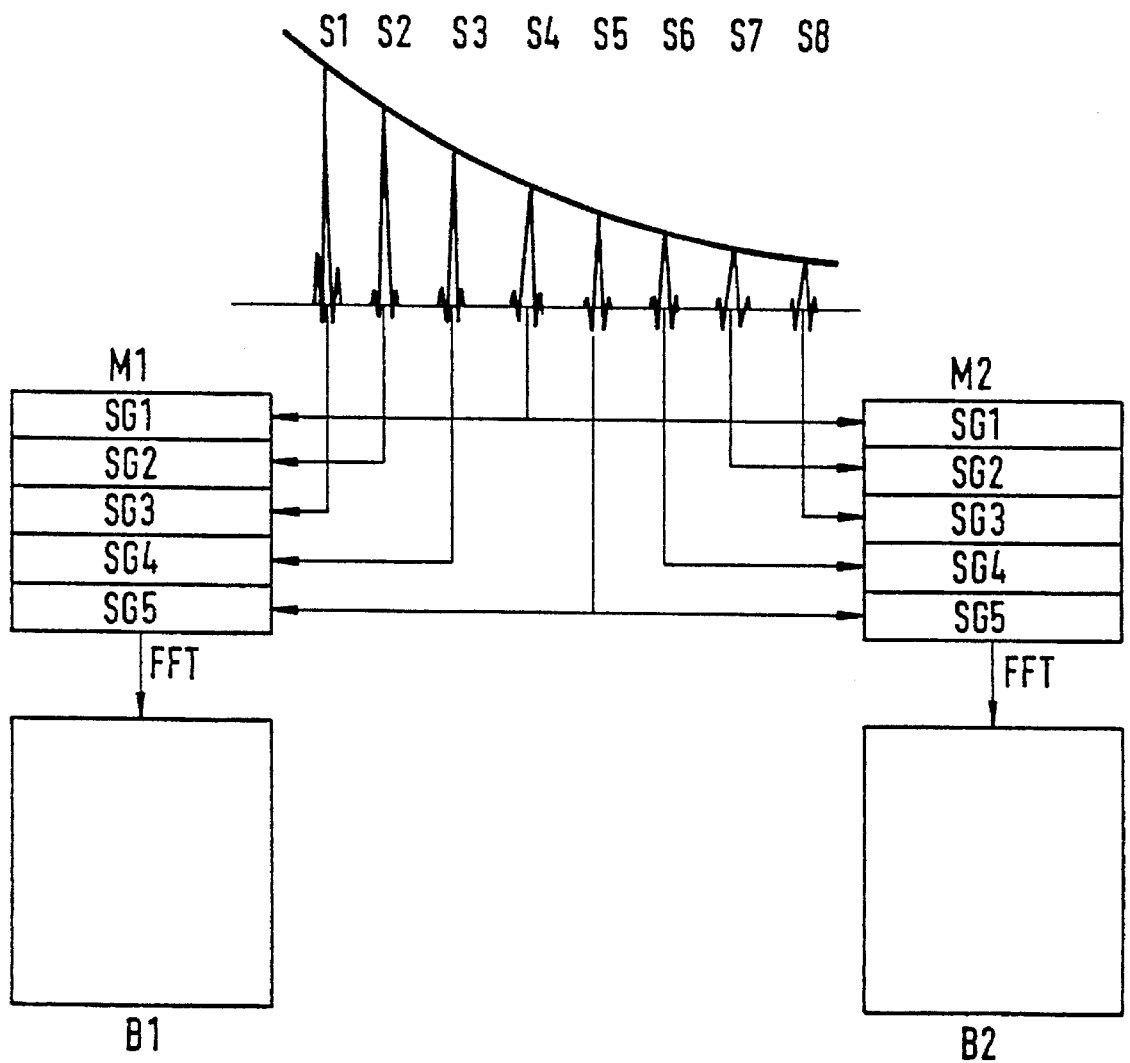
FIG. 5 illustrates the classification of echoes according to a conventional "shared echo" method.

As may be clearly seen in FIG. 1, the nuclear magnetic resonance signals in the form of spin echoes S1–S8 are dependent on the T2 decay to highly different degrees. This can be utilized to acquire images with different T2 contrast within a pulse sequence by entering the spin echoes that are less affected by the T2 decay into a first raw data matrix for producing a first image matrix and entering the spin echoes that are more greatly affected by the T2 decay into a second raw data matrix for producing a second image matrix. Measuring time can thereby be saved with the known "shared echo" technique in that nuclear magnetic resonance signals are employed in common for both raw data matrices for the edge rows of both raw data matrices. This is schematically shown in FIG. 5. M1 references a raw data matrix for the acquisition of a proton-density-weighted image and M2 references a raw data matrix for producing a T2-weighted image. Each of the eight nuclear magnetic resonance signals S1–S8 is entered into a row of the raw data matrices M1 and/or M2. The raw data matrices M1 and M2—which represent a K-space in the terminology of nuclear magnetic resonance technology—are divided into segments SG1–SG5 whose number corresponds to the number of nuclear magnetic resonance signals 5 acquired after each excitation phase for the associated raw data matrix M1 or M2. In the exemplary embodiment, the nuclear magnetic resonance signal S1 is employed for the middle segment SG3 of the raw data matrix M1, the nuclear magnetic resonance signals S2 and S3 are employed for the neighboring segments SG2 and SG4, the nuclear magnetic resonance signals S4 and S5 are employed in common for the edge segments SG1 and SG5 of the two raw data matrices M1 and M2, the nuclear magnetic resonance signal S8 is employed for the middle segment SG3 of the raw data matrix M2, and the nuclear magnetic resonance signals S6 and S7 are employed for the neighboring segments SG2 and SG4 of the second raw data matrix M2.

The illustrated pulse sequence is repeated with corresponding selection (change) of the phase-encoding of the nuclear magnetic resonance signals until all rows in all segments of the two raw data matrices M1 and M2 are occupied.

Image matrices B1 and B2 are acquired by respective two-dimensional Fourier transformation from the raw data matrices M1 and M2. The contrast of the acquired images is essentially defined by the central rows of the raw data matrices M1 and M2, i.e. by the rows in the segments SG2–SG4. The edge rows, i.e. the segments SG1 and SG5 essentially define the resolution. Since the nuclear magnetic resonance signals in the segments SG2–SG4 of the raw data matrix M1 are occupied with the nuclear magnetic resonance signals S1–S3 that are less affected by the T2 decay, a proton-density-weighted image can be acquired from the raw data matrix M1. The middle segments SG2–SG4 of the raw data matrix M2, by contrast, are occupied by nuclear magnetic resonance signals S6–S8 that are highly T2-dependent. A T2-weighted image can thus be acquired from the raw data matrix M2. Substantial measuring time can be saved by employing the nuclear magnetic resonance signals S4 and S5 in common for the raw data matrices M1 and M2.

It must be accepted in the illustrated, known technique, however, that nuclear magnetic resonance signals S4 and S5 that already have a rather pronounced dependency must also be employed for the raw data matrix M1. This, however, leads to edge oscillation artifacts in the proton density image produced therefrom and may also lead to a mixed contrast that differs noticeably from the proton density image of a conventional spin echo sequence. This problem becomes particularly serious when a small read-out bandwidth is employed in the nuclear magnetic resonance signal acquisition, since k-space segments having pronounced T2-weighting must then also be employed for the proton-density-weighted raw data matrix M1. This is explained below with reference to FIGS. 6 and 7.

The chemical shift in the examination subject is always a lower limit in the selection of the read-out bandwidth, since the read-out bandwidth can not be selected so small that nuclear magnetic resonance signals from specific parts of the subject are no longer acquired due to the chemical shift of the nuclear magnetic resonance signals-this would lead to pronounced shift artifacts. The chemical shift in the examination subject is proportional to the magnetic field strength, i.e. it is larger in high-field systems than in low-field systems. It is also true that the read-out time window becomes longer as the read-out bandwidth becomes smaller.

Figure 6:
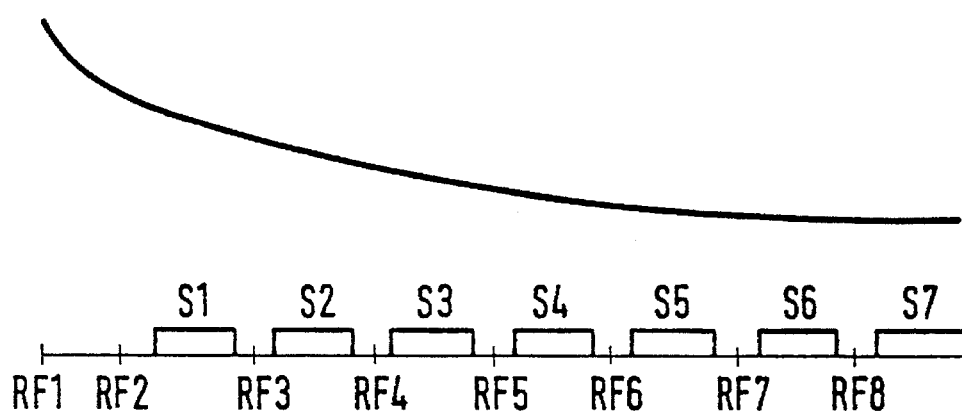
FIG. 6 illustrates the signal decay which occurs in the turbo-spin echo sequence together and in a schematically illustrated pulse sequence given a high read-out bandwidth.

FIG. 6 schematically shows a turbo-spin echo sequence having an excitation pulse RF1 and eight refocusing pulses RF2–RF9 and also shows the T2-dependency of the signal amplitude. FIG. 6 refers to a high-field system having a necessarily relatively large read-out bandwidth, so that the time windows shown as rectangles are relatively short for the nuclear magnetic resonance signals S1–S7. By comparison thereto, FIG. 7 refers to a nuclear magnetic resonance tomography system having a lower field strength, and thus longer time windows for the data acquisition.

Figure 7:
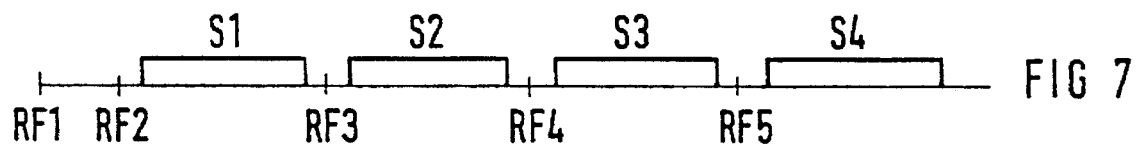
FIG. 7 illustrates a schematic pulse sequence given a small read-out bandwidth.

It becomes clear by comparing FIGS. 6 and 7 that the second signal S2 in a nuclear magnetic resonance tomography system having a lower field strength is already substantially more dependent on the T2 decay than in a nuclear magnetic resonance tomography system having a higher field strength. Moreover, fewer nuclear magnetic resonance signals S1–S4 can be acquired before the nuclear magnetic resonance signal has decayed to a predetermined amplitude due to the T2 decay. The relatively pronounced T2-dependency of early nuclear magnetic resonance signals leads to the fact that the aforementioned problems with respect to the proton-density-weighted image are further aggravated (edge oscillation artifacts, mixed contrast).

Of course, one could also employ a larger read-out bandwidth, i.e. short read-out time intervals given low field strengths. This, however, is ineffective since no signal-to-noise advantage can be achieved when compared to a conventional spin echo sequence with, typically, an extremely low read-out bandwidth given a low field strength. Given the longer read-out time interval, moreover, more time is employed, as a percentage of the total examination time, for the data acquisition and less time is employed for the radio-frequency excitation and phase-encoding. The signal-to-noise ratio at a predetermined measuring time is improved by the proportionately lengthened data acquisition time.

The aforementioned problems in the proton-density-weighted image can be avoided with the present invention without having to forego the advantages of the low bandwidth with a long data acquisition window. This is achieved in that fewer rows are acquired for the first raw data matrix M1 after each excitation phase than are acquired for the second raw data matrix M2.

Figure 8:
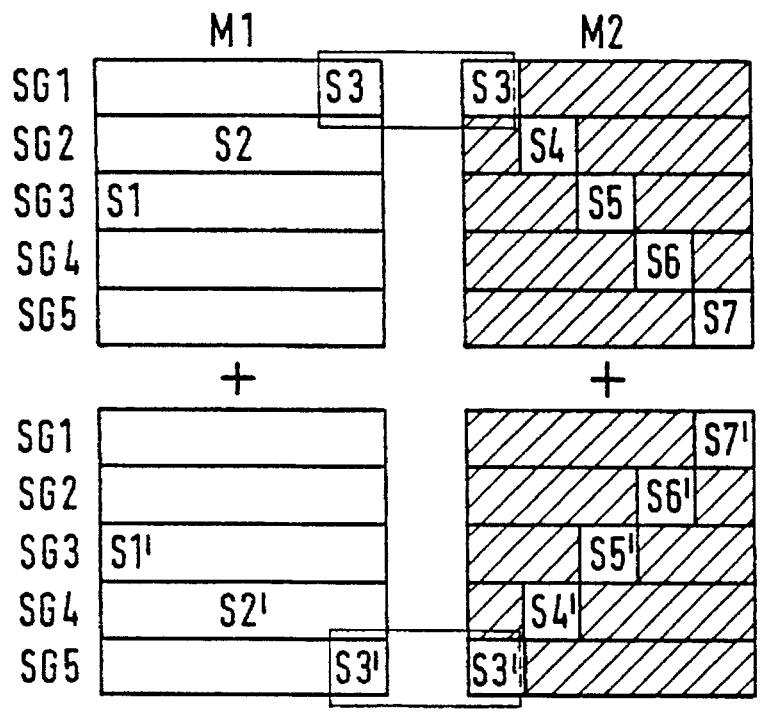
FIGS. 8 and 9 respectively show two examples for the ordering of raw data in raw data matrices in accordance with the principles of the present invention.

An exemplary embodiment of the invention for the occupation (filling) of the raw data matrices M1 and M2 is shown in FIG. 8 for seven nuclear magnetic resonance signals after every excitation phase. Each raw data matrix M1 and M2 is divided into seven segments. The most strongly proton-density-weighted signal S1 is entered into the middle segment SG3 of the first raw data matrix M1 and the following, still relatively highly proton-density-weighted, signals S2 and S3 are entered into the following segments SG2, SG1. The nuclear magnetic resonance signal S3 is also employed for the uppermost segment SG1 of the second raw data matrix M2. The following segments SG2–SG5 of the second raw data matrix M2 are filled with the following, more strongly T2-weighted nuclear magnetic resonance signals S4–S7. After this first step, one row is occupied in every segment of the second raw data matrix M2 but this is true only in half the segments of the raw data matrix M1. After a second excitation, the nuclear magnetic resonance signals S1'–S3' are entered into the segments SG3–SG5 of the raw data matrix M1 in a downward direction beginning with the middle segment SG3. The nuclear magnetic resonance signal S3 is simultaneously employed for the lowest segment SG5 of the second raw data matrix M2 and the following nuclear magnetic resonance signals S4'–S7' are sorted into the segments SG5–SG1 of the second raw data matrix M2 in an upward direction. All segments SG1–SG5 of the raw data matrix M1 are thus occupied in two passes, with a double occupation, that can be employed for averaging the signals, being present in the middle segment SG3. The rows are doubly occupied in all segments SG1–SG5 in the raw data matrix M2, so that an averaging with respect to all rows can ensue.

The signal-to-noise ratio of the T2-weighted image acquired from the raw data matrix M2 is improved by the averaging. Without this averaging, the T2-weighted image would have a poorer signal-to-noise ratio than the proton-density-weighted image, since the T2-weighted signals have a lower amplitude due to the T2 decay. In the illustrated technique, relatively early nuclear magnetic resonance signals having low T2 dependency are also employed for the edge rows of the raw data matrix M1, so that edge oscillation artifacts and mixed contrasts are avoided. Moreover, longer echo trains, i.e. more nuclear magnetic resonance signals per excitation, can be employed since only a smaller part of the echo train is now employed for the proton-density-weighted image.

The double sampling of the k-space in the second raw data matrix M2 shown in FIG. 8 has the following, further advantage. The sampling of the k-space ensues once from top to bottom and then in the opposite direction. The amplitudes of the nuclear magnetic resonance signals S3–S7 differ significantly due to the T2 decay. Since, however, a strong signal is always averaged with a weak signal given the sorting and averaging of the signals shown in FIG. 8, the amplitude distribution in the k-space becomes symmetrical. The image quality is thus improved, the sharpness is increased and the edge oscillation artifacts are diminished.

A symmetrical amplitude distribution is also established in the raw data matrix M1 since respective signals of the same amplitude are symmetrically arranged relative to the middle segments SG3. In conventional methods, however, there was always the problem of an asymmetrical amplitude distribution, leading to image degradation.

Figure 9:
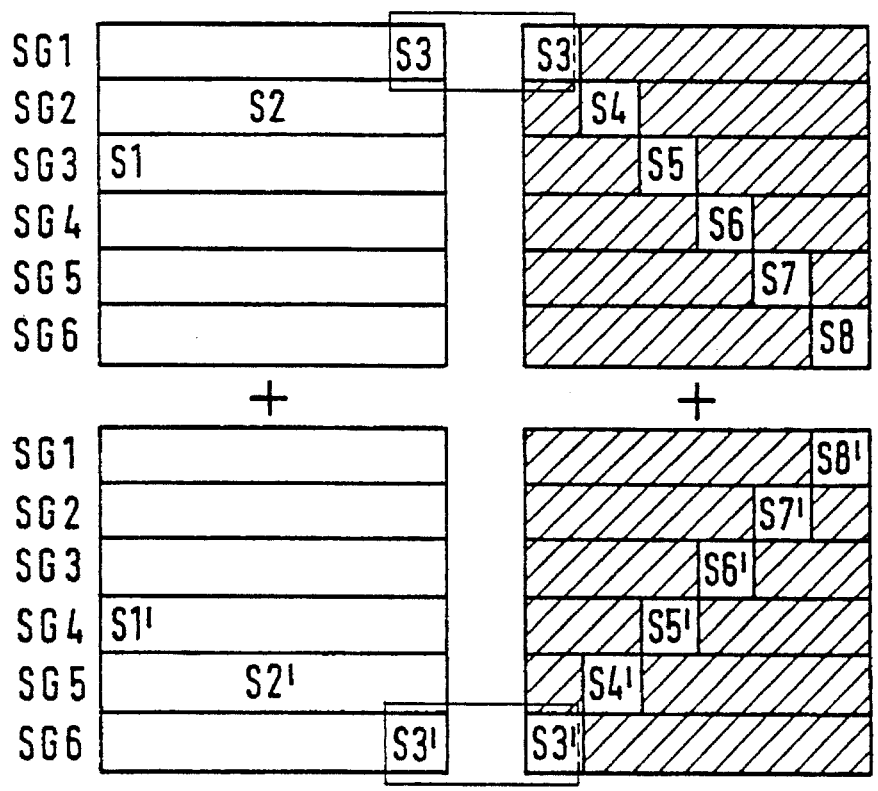

FIG. 9 shows a further exemplary embodiment wherein each raw data matrix M1 and M2 is divided into six segments SG1–SG6, with eight nuclear magnetic resonance signals S1–S8 being acquired after every excitation. Again, all segments of the raw data matrices M1 and M2 are occupied with only one row only after two excitations, and the signals S3, S3' are again employed in common for both raw data matrices. In the example of FIG. 9, an averaging occurs in all segments SG1–SG8 of the raw data matrix M2; averaging is not carried out in the raw data matrix M1.

Figure 10:
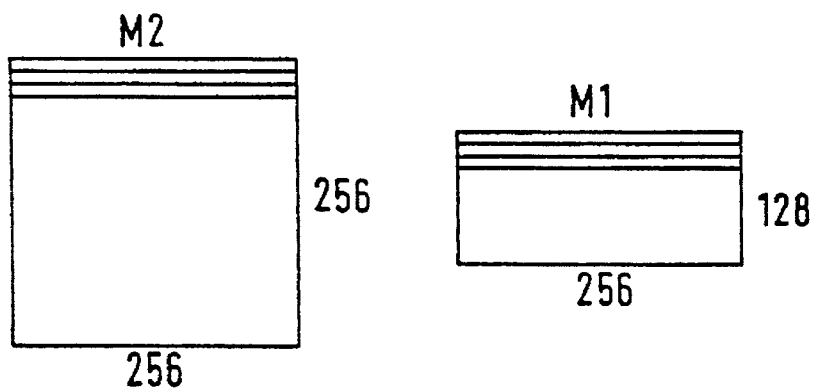
FIGS. 10 and 11 respectively show exemplary embodiments of raw data matrices filled in accordance with the invention.

Two excitation phases are respectively necessary in the exemplary embodiments of FIGS. 8 and 9 in order to fill one row in each segment SG1–SG5 of the raw data matrix M1. One can, however, employ only one excitation phase if the raw data matrix M1 has a smaller number of rows compared to the raw data matrix M2, i.e., for example, half the number of rows, by employing half as many nuclear magnetic resonance signals per excitation phase for the raw data matrix M1 than are employed for the raw data matrix M2. Corresponding to FIG. 10, for example, only half the k-space—128 rows—can thereby be sampled. This in fact involves a loss of resolution but the signal-to-noise ratio is improved. The proton density image is only employed as a comparison image in many instances, so that reduced resolution is adequate.

Figure 11:
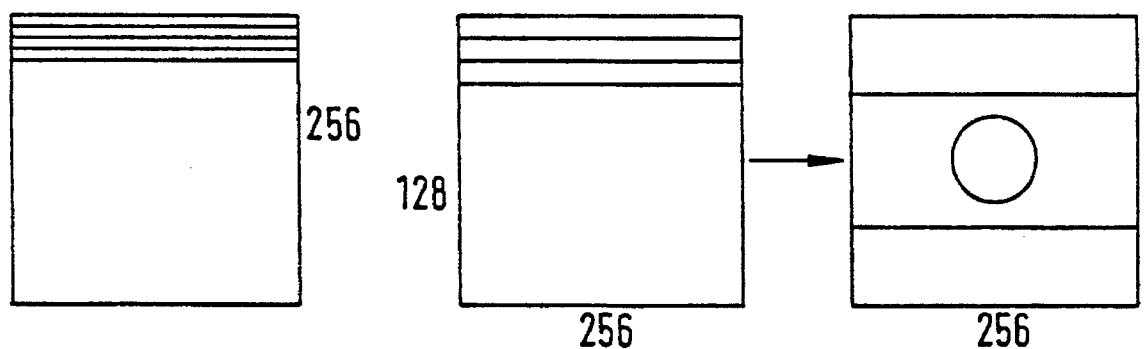

According to FIG. 11, alternatively, the entire k-space can in fact be sampled but with a doubling of the phase-encoding steps, so that the k-space is completely occupied with 128 rows. Only a rectangular field of view is thereby acquired, and the image distortion caused by doubling the phase-encoding steps must in turn be canceled.

Instead of filling half the raw data matrix M1 and the entire raw data matrix M2 in one excitation phase, some other fraction, for example one-third of the raw data matrix M1, can alternatively be filled in the first excitation phase. Three excitation phases are then required in order to fill the raw data matrix M1, whereas the raw data matrix M2 can be averaged three times. Of course, this division ratio for the raw data matrix M1 can also be combined with a reduced number of rows or with a rectangular field of view, as set forth above.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a nuclear magnetic resonance tomography apparatus for acquiring two differently weighted images, comprising the steps of:

(a) disposing an examination subject in a constant, uniform magnetic field;

(b) in an excitation phase, exciting nuclear spins in said examination subject by emitting a first radio-frequency pulse;

(c) in a read-out phase, emitting a plurality of radio-frequency refocusing pulses in succession, each refocusing pulse being followed by at least one nuclear magnetic resonance signal arising from the excited nuclear spins, each nuclear magnetic resonance signal being spatially-encoded by phase-encoding and read-out gradients;

(d) sampling said nuclear magnetic resonance signals and entering nuclear magnetic resonance signals lying chronologically closer to said excitation phase into rows of a k-space of a first raw data matrix and entering nuclear magnetic resonance signals lying chronologically farther from said excitation phase into rows of k-space of a second raw data matrix, with fewer rows of said first raw data matrix being filled than of said second raw data matrix after each excitation phase;

repeating steps (b), (c) and (d) until all rows of both of said first and second raw data matrices are filled; and producing a first image from said first raw data matrix by Fourier transformation of the nuclear magnetic resonance signals contained therein and producing a second image from said second raw data matrix by Fourier transformation of the nuclear magnetic resonance signals contained therein.

2. A method a claimed in claim 1 comprising the additional steps of:

dividing the rows of each of said first and second raw data matrices into a plurality of segments with the number of segments of said first raw data matrix being lower than the number of segments of said second raw data matrix; and filling one row in each segment of each of said first and second raw data matrices per excitation phase.

3. A method as claimed in claim 2 wherein the step of phase-encoding said nuclear magnetic resonance signals comprises phase-encoding the nuclear magnetic resonance signals respectively entered into said first and second raw data matrices in equal phase-encoding steps corresponding to the lower number of nuclear magnetic resonance signals entered in said first raw data matrix, and comprising the additional step of providing said first raw data matrix with a number of rows which is lower than the number of rows in said second raw data matrix.

4. A method as claimed in claim 2 wherein the step of phase-encoding said nuclear magnetic resonance signals comprises phase-encoding nuclear magnetic resonance signals to be entered into said first raw data matrix with phase-encoding steps which are larger than phase-encoding steps for said nuclear magnetic resonance signals to be entered into said second raw data matrix and thereby filling said first raw data matrix with a number of rows corresponding to a number of nuclear magnetic resonance signals available, and correcting for any image distortion existing in said first raw data matrix.

5. A method as claimed in claim 1 comprising the additional step of averaging the nuclear magnetic resonance signals in said second raw data matrix until said first raw data matrix is completely occupied.

6. A method as claimed in claim 5 comprising the additional step of occupying the rows of said second raw data matrix successively in opposite directions from a central row of said second raw data matrix.

7. A method as claimed in claim 1 wherein each of said first and second raw data matrices has a central row and wherein each of said first and second raw data matrices has edge rows disposed farthest from said central row, and comprising the additional step of using the same nuclear magnetic resonance signals for entering into said edge rows of both said first and second raw data matrices.

* * * * *